United States Patent
Chao-Yuan et al.

(10) Patent No.: US 8,957,504 B2
(45) Date of Patent: Feb. 17, 2015

(54) INTEGRATED STRUCTURE WITH A SILICON-THROUGH VIA

(71) Applicants: Huang Chao-Yuan, Hsinchu (TW); Ho Yueh-Feng, Hsinchu (TW); Yang Ming-Sheng, Hsinchu (TW); Chen Hwi-Huang, Hsinchu (TW)

(72) Inventors: Huang Chao-Yuan, Hsinchu (TW); Ho Yueh-Feng, Hsinchu (TW); Yang Ming-Sheng, Hsinchu (TW); Chen Hwi-Huang, Hsinchu (TW)

(73) Assignee: IP Enval Consultant Inc., Hsinchu (TW)

(*) Notice: Subject to any disclaimer, the term of this patent is extended or adjusted under 35 U.S.C. 154(b) by 0 days.

(21) Appl. No.: 13/833,786

(22) Filed: Mar. 15, 2013

(65) Prior Publication Data

US 2014/0264916 A1    Sep. 18, 2014

(51) Int. Cl.
   H01L 29/40    (2006.01)
   H01L 23/48    (2006.01)
   H01L 23/52    (2006.01)
   H01L 23/544   (2006.01)

(52) U.S. Cl.
   CPC .................................. *H01L 23/481* (2013.01)
   USPC .... 257/621; 257/774; 257/797; 257/E21.597; 257/E23.011; 257/E23.174; 257/E23.179

(58) Field of Classification Search
   USPC .......... 257/621, 774, 797, E21.597, E23.011, 257/E23.174, E23.179
   See application file for complete search history.

(56) References Cited

U.S. PATENT DOCUMENTS

| | | | |
|---|---|---|---|
| 7,799,678 B2 | 9/2010 | Kropewnicki et al. | |
| 7,969,013 B2 * | 6/2011 | Chen et al. | 257/774 |
| 7,989,918 B2 | 8/2011 | Bartley et al. | |
| 8,008,195 B2 * | 8/2011 | Koike et al. | 438/667 |
| 8,102,064 B2 * | 1/2012 | Renn | 257/797 |
| 8,103,996 B2 | 1/2012 | Kariat et al. | |
| 8,136,084 B2 | 3/2012 | Dean, Jr. et al. | |
| 8,143,704 B2 * | 3/2012 | West | 257/621 |
| 8,227,889 B2 * | 7/2012 | Kuo | 257/508 |
| 8,319,336 B2 | 11/2012 | Chang et al. | |
| 8,332,803 B1 | 12/2012 | Rahman | |
| 8,344,749 B2 | 1/2013 | Stillman et al. | |
| 8,350,362 B2 * | 1/2013 | Byeon et al. | 257/621 |
| 8,359,554 B2 | 1/2013 | Wang et al. | |
| 8,362,622 B2 | 1/2013 | Sproch et al. | |
| 2010/0121994 A1 | 5/2010 | Kim et al. | |
| 2010/0257495 A1 | 10/2010 | Wu | |
| 2011/0147909 A1 | 6/2011 | Hsuan et al. | |
| 2012/0106117 A1 | 5/2012 | Sundaram et al. | |
| 2012/0124532 A1 | 5/2012 | Coteus et al. | |
| 2012/0273782 A1 | 11/2012 | Goel et al. | |
| 2012/0304142 A1 | 11/2012 | Morimoto et al. | |
| 2012/0331435 A1 | 12/2012 | Rahman | |
| 2013/0032799 A1 * | 2/2013 | Yen et al. | 257/48 |
| 2013/0134583 A1 * | 5/2013 | Tsukiyama et al. | 257/737 |
| 2013/0341799 A1 * | 12/2013 | Chen et al. | 257/774 |

FOREIGN PATENT DOCUMENTS

WO    WO2012082092 A1    6/2012

* cited by examiner

*Primary Examiner* — Ida M Soward
(74) *Attorney, Agent, or Firm* — Alan D. Kamrath; Kamrath IP Lawfirm, P.A.

(57) ABSTRACT

An integrated structure with a silicon-through via includes a substrate, a through-silicon via penetrating the substrate, a conductive protective structure surrounding the through-silicon via and a first and a second conductive dummy patterns with different shapes disposed between the through-silicon via and the conductive protective structure.

20 Claims, 3 Drawing Sheets

INTEGRATED STRUCTURE WITH A SILICON-THROUGH VIA

FIELD OF THE INVENTION

The present invention relates to an integrated structure with a silicon-through via.

BACKGROUND OF THE INVENTION

To save precious layout space or increase interconnection efficiency, multiple chips of integrated circuits (ICs) can be stacked together as a single IC package. To that end, a three-dimensional (3D) stack packaging technology is used to package the chips of integrated circuits. Through-silicon vias (TSVs) are widely used to accomplish the 3D stack packaging technology. A through-silicon via is a vertical conductive via completely passing through a silicon wafer, a silicon board, a substrate of any material or die. Nowadays, a 3D integrated circuit (3D IC) is applied to a lot of fields such as memory stacks, image sensors or the like.

Compared to a single transistor or a single interconnect metal line, a through-silicon via comes with a size of hundred fold or more. To share the same manufacturing process with integrated circuits would mean difficulties to control process uniformity and/or keep process window. Furthermore, the gigantic TSVs would produce mechanical stress and electrical interference affecting the devices around them. Hence, there is a need to completely eliminate or at least reduce this issue.

SUMMARY OF THE INVENTION

In one embodiment of the present invention, an integrated structure with a silicon-through via is provided to comprise a substrate, a through-silicon via penetrating the substrate, a conductive protective structure surrounding the through-silicon via and a first and a second conductive dummy patterns with different shapes disposed between the through-silicon via and the conductive protective structure.

In another embodiment of the present invention, an integrated structure with a silicon-through via is provided to comprise a substrate, a through-silicon via penetrating the substrate, a conductive protective structure surrounding the through-silicon via and a first and a second alignment marks with different shapes disposed between the through-silicon via and the conductive protective structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The following is the detailed description of the preferred embodiments of this invention. All the elements, sub-elements, structures, materials, arrangements recited herein can be combined in any way and in any order into new embodiments, and these new embodiments should fall in the scope of this invention defined by the appended claims. A person skilled in the art, upon reading this invention, should be able to modify and change the elements, sub-elements, structures, materials, arrangements recited herein without being apart from the principle and spirit of this invention. Therefore, these modifications and changes should fall in the scope of this invention defined only by the following claims.

There are a lot of embodiments and figures in this application. To avoid confusions, similar components are represented by same or similar numerals. To avoid complexity and confusions, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

Figure 1:
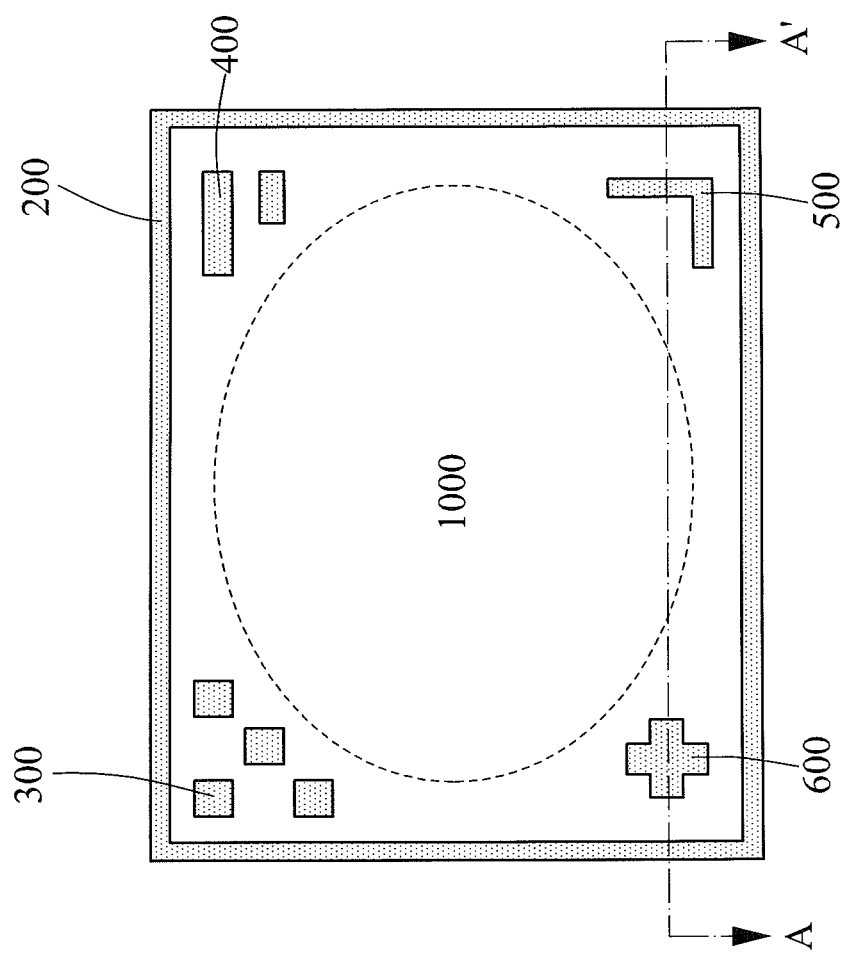
FIG. 1 shows a schematic top view of an integrated structure with a through-silicon via (TSV) in accordance with an embodiment of the present invention.

Now refer to FIG. 1, which shows a schematic top view of an integrated structure with a through-silicon via (TSV) 1000 in accordance with an embodiment of the present invention. In the present invention, the focus is on what's around TSVs not what's above TSVs, so the interconnects above TSVs are omitted to keep the figures plain and simple. The TSV 1000 (in some references also known as through electrode, conductive post . . . etc.) passes "through" a substrate 100 (not shown in FIG. 1, please refer to FIG. 2-3) and physically and electrically connect the backside and front side of substrate 100. The TSV 1000 is configured to couple operation voltage VSS, VDD or operational signal to the integrated circuits (not shown) formed on the substrate 100. Compared to normal active devices such as transistors, TSV 1000 has a much bigger size in a scale of micrometers. In one embodiment, TSV 1000 has a diameter of 30 µm. In another embodiment, TSV 1000 has a diameter of 10 µm. In a further embodiment, TSV 1000 has a diameter of 6 µm.

Still refer to FIG. 1, since the gigantic TSV 1000 may produce mechanical stress and electrical interference affecting the active devices (not shown) such as MOS transistors around it, a protective structure 200 is disposed to surround the TSV 1000 in order to isolate TSV 1000 physically and electrically from the active devices around it. The protective structure 200 shown in FIG. 1 has a rectangle or square shape. However, the protective structure 200 is not limited in its shape and how far it extends vertically as long as it is a closed structure surrounding the TSV within it.

Aside from the mechanical stress and electrical interference caused by the TSV 1000, its gigantic size would also induce non-uniformity in thickness, in critical dimension (CD) and in profile after some processes sensitive to pattern density/pattern distribution such as etching processes and chemical mechanical polishing (CMP) processes. For overcoming these process difficulties, dummy patterns 200 and 300 with different shapes are introduced between the empty space between the protective structure 200 and the TSV 1000. The size and shape of the dummy patterns 200 and 300 need not to be limited. Although only two kinds of dummy patterns (that is 200 and 300) are shown in FIG. 1, more kinds of dummy patterns with different geometric features may be introduced as long as they can help to improve process uniformity and to relief mechanical stress caused by TSV 1000.

In most of the integrated circuit (IC) manufacturing processes, mass amount of alignment marks are needed for photolithography process, defect inspections . . . etc. These marks are usually space demanding and contributes nothings to the electrical functions. In the present invention, some of these marks such as alignment marks 500 and 600 may be disposed around the TSV 1000 and the protective structure 200 to save space. The shapes, sizes and functions of these marks are not limited as long as they can perform the functions they supposed to perform.

Figure 2:
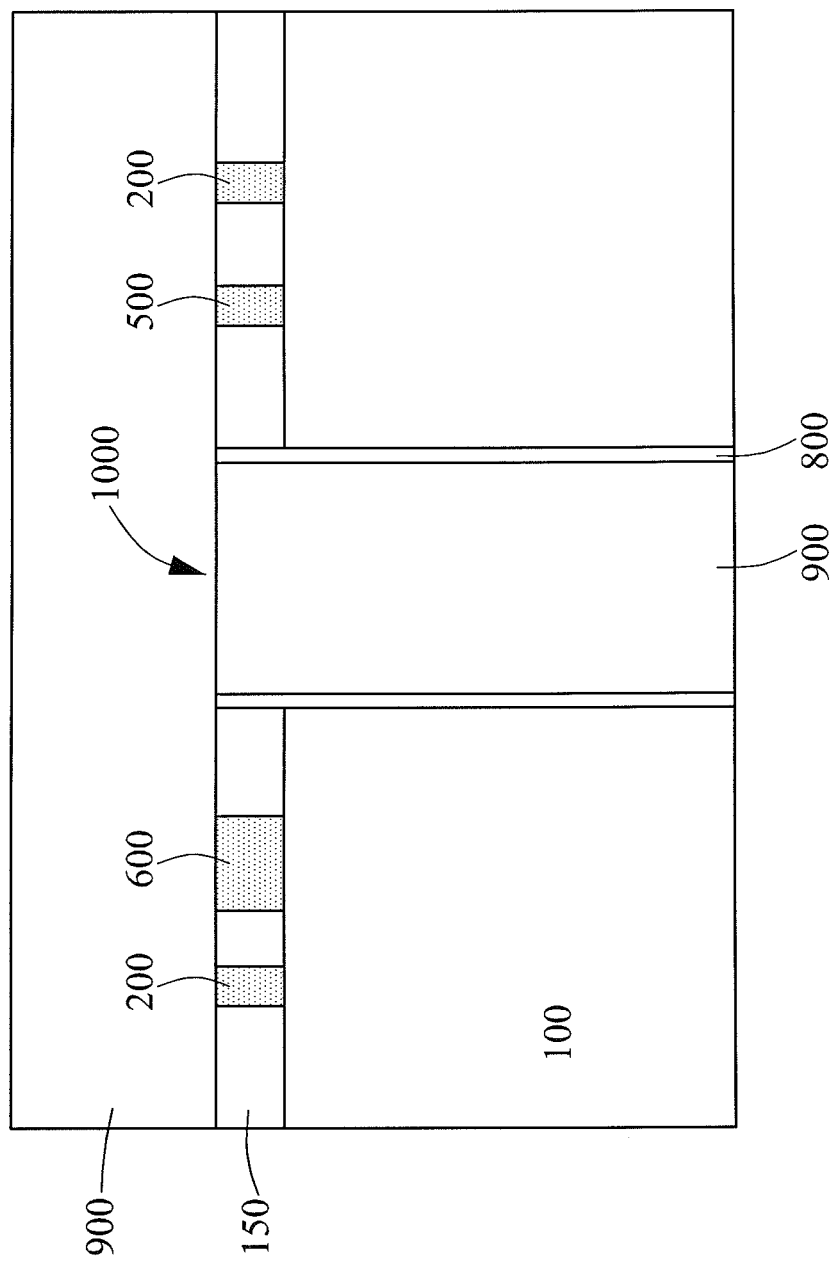
FIG. 2 shows a schematic cross-sectional view of the integrated structure with a TSV taken along line A-A' of FIG. 1 in accordance with an embodiment of the present invention.

Now please refer to FIG. 2, which shows a schematic cross-sectional view of the integrated structure with the TSV 1000 taken along line A-A' of FIG. 1 in accordance with an embodiment of the present invention. A substrate 100 is provided. As shown in FIG. 2, TSV 1000 penetrates the substrate 100, couple the front side and backside of the substrate 100 and protrude from the front side. The substrate 100 can be a Si substrate, a polymer substrate, a silicon-on-insulator substrate, a SiC substrate, a composite substrate . . . etc. The backside is the side having no active devices such as transistors formed thereon. The backside of the substrate 100 is the opposite side of the front side of the substrate 100, wherein active devices such as transistors and interconnect structures are formed on the front side.

Figure 3:
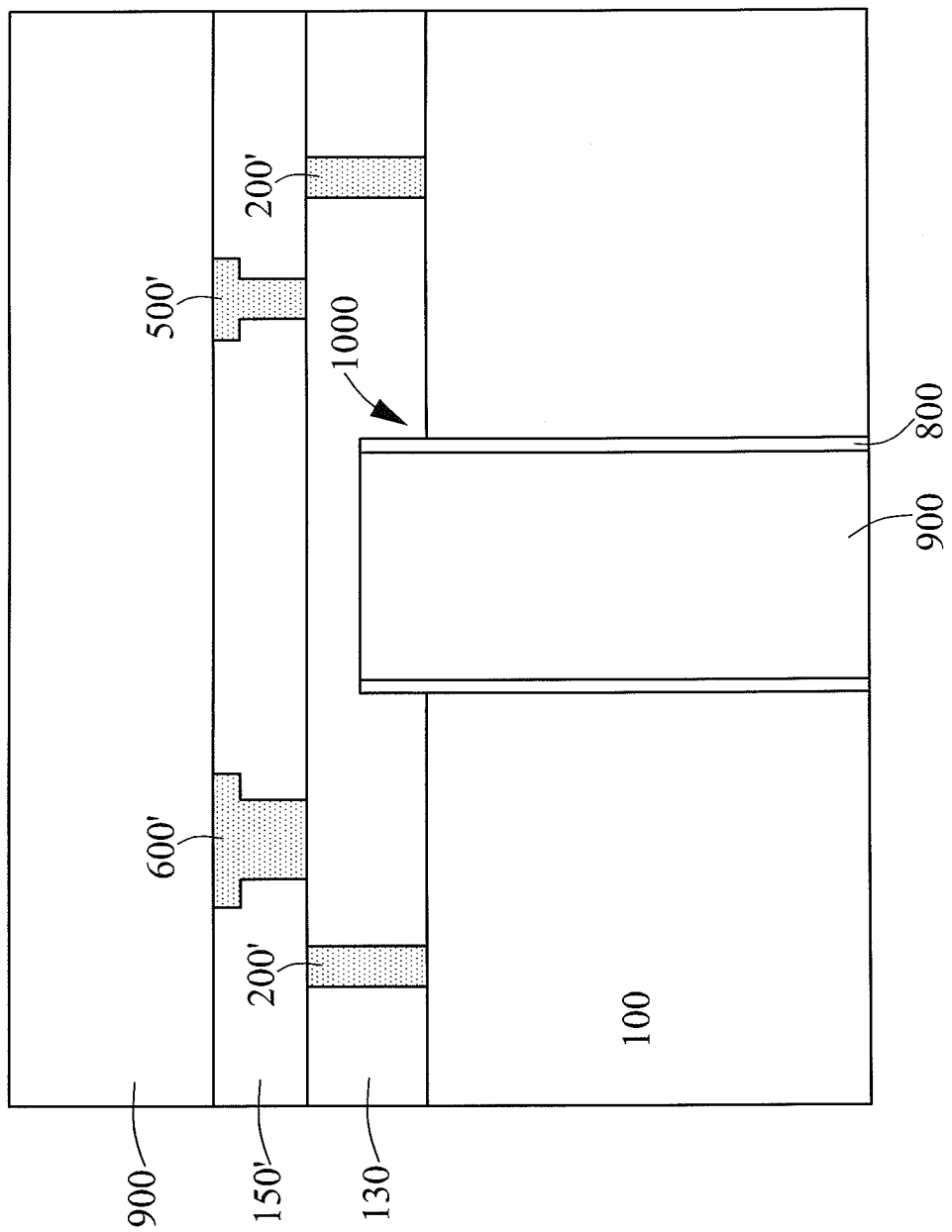
FIG. 3 shows a schematic cross-sectional view of the integrated structure with a TSV taken along line A-A' of FIG. 1 in accordance with another embodiment of the present invention.

The TSV 1000 shown in FIG. 2-3 seems to be a TSV made from a via middle process, however TSV 1000 may be made from a via first process (via is made before transistors), a via middle process (via is made after transistors and during lower interconnects) or a via last process (via is made after interconnects). No matter what kind of process is adopted to fabricate TSV 1000, the basic structure of TSV 1000 is the same: a through-silicon hole, a dielectric layer 800 lining on the wall of the through-silicon hole, and a conductive material 900 filled in the through-silicon hole. The material/materials used for the dielectric layer 800 and the conductive material 900 may depend on the manufacturing process and the physical properties needed. Silicon oxide and/or silicon nitride are the most commonly used material/materials for the dielectric layer 800. As to the conductive material 900, it may comprise a barrier/glue layer material such as Ta, TaN, Ti, TiN, W, WN, Mo, Mn, Cu and a low-resistivity material such as W, Cu, Al, poly silicon. It is noted that the dielectric layer 800 may rather be formed by thermal oxidation than deposition, then the dielectric layer 800 may not extend to the inter-layer dielectric layer 150 or the interconnect/device layer 130.

Disposed around the TSV 1000 is the inter-layer dielectric layer 150. Inter-layer dielectric layer 150 may be a single-layered or multi-layered structure comprising one or more dielectric material selected from silicon dioxide, silicon nitride, SiC, SiON, SiCN, TEOS-based silicon dioxide, low-k dielectric materials . . . etc. As shown in FIG. 2, the protective structure 200 and marks 500 and 600 are conductive contacts embedded in the inter-layer dielectric layer 150. They can be made by the same single damascene processes. That is, they may be formed by forming one or more contact holes, forming one or more conductive materials on the substrate filling in the contact holes then performing a chemical mechanical polishing process to remove excess materials and form a global flat surface. The conductive materials used for the protective structure 200 and marks 500 and 600 comprise a barrier/glue material and a low-resistivity filling material. The barrier/glue material may be selected from Ta, TaN, Ti, TiN, W, WN, Mo, Mn, Cu, and the barrier/glue material preferably be Ta/TaN or Ti/TiN. The low-resistivity filling material may be selected from W, Cu, Al, poly silicon and the low-resistivity filling material preferably is W. Although not shown in FIG. 2, dummy patterns 300 and 400 are also conductive contacts embedded in the inter-layer dielectric layer 150. It appears from FIG. 1, dummy patterns 300 and 400, marks 500 and 600 are disposed at four different corners of the protective structure 200, but the present invention is not limited. Different dummy patterns can be disposed at the same corner of the protective structure 200 and a plurality of marks of the same shape can be disposed at the same corner of the protective structure 200.

Disposed above the TSV 1000, inter-layer dielectric layer 150, protective structure 200, marks 500 and 600, and dummy patterns 300 and 400 is a interconnect layer 900. Interconnect layer 900 represents all the inter-metal dielectric layers and all the interconnect structures embedded within. It should be understood, FIG. 1-3 only show a part of a complete picture, therefore the substrate 100 may comprise shallow trench isolation structure and every kinds of doped regions while the inter-layer dielectric layer 150 may comprise active devices such as MOS transistors, passive devices such as resistors and other dummy patterns.

Now please refer to FIG. 3, which shows a schematic cross-sectional view of the integrated structure with TSV taken along line A-A' of FIG. 1 in accordance with another embodiment of the present invention. Not like the embodiment shown in FIG. 2, in this embodiment dielectric layer 150' corresponding to the dielectric layer 150 is not directly on the substrate 100 around TSV 1000. Between the dielectric layer 150' and the substrate 100 is an interconnect/device layer 130. The interconnect/device layer 130 may comprise one or more dielectric layers with interconnect structures embedded therein and/or active devices formed on substrate 100. Aside from the dielectric layer 150', the protective structure 200 embedded in the inter-layer dielectric layer 150 in FIG. 2 is replaced by protective structure 200' embedded in the interconnect/device layer 130. The marks 500' and 600' in this embodiment corresponding to the marks 500 and 600 are made by dual damascene process instead of single damascene process. From this embodiment, it is clear that the protective structure 200/200' should be at the same level (embedded in the same dielectric layer) with active devices so it can isolate the TSV 1000 from the active devices. The dummy patterns and the marks between the protective structure and TSV can be at different level (embedded in the different dielectric layer) from the protective structure.

Although not shown in FIGS. 1-3, the substrate 100 may comprise shallow trench isolation structures right beneath the protective structure 200/200', dummy patterns 300 and 400, and marks 500 and 600 in order to isolate them from other functional active devices or routing interconnect. These shallow trench isolation structures may adapt different shapes and sizes to suit the protective structure 200/200', dummy patterns 300 and 400, and marks 500 and 600.

In this way, the present invention manages to isolate the TSV from the active devices in order to reduce the impacts caused by TSV on the active devices. The present invention also manages to make good use of the space around TSV and keep good process uniformity by adding marks and dummy patterns around TSV.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated structure with a silicon-through via, comprising:

a substrate;

a through-silicon via penetrating the substrate, the through-silicon via comprising a through-silicon hole, a dielectric layer lining on a wall of the through-silicon hole and a conductive material filled in the through-silicon hole;

a conductive protective structure surrounding the through-silicon via; and a first and a second conductive dummy patterns with different shapes disposed between the through-silicon via and the conductive protective structure, wherein the first and second conductive dummy patterns are physically separated from the through-silicon via.

2. The integrated structure of claim 1, wherein the conductive protective structure, the first and the second conductive dummy patterns are disposed within the same dielectric layer.

3. The integrated structure of claim 1, wherein the conductive protective structure, the first and the second conductive dummy patterns are disposed within different dielectric layers.

4. The integrated structure of claim 1, wherein the conductive protective structure has a rectangle or square shape.

5. The integrated structure of claim 4, wherein the first and the second conductive dummy patterns are disposed at different corners of the conductive protective structure.

6. The integrated structure of claim 1, further comprising an alignment mark disposed between the conductive protective structure and the through-silicon via.

7. The integrated structure of claim 6, wherein the conductive protective structure and the alignment mark are disposed within the same dielectric layer.

8. The integrated structure of claim 6, wherein the conductive protective structure and the alignment mark are disposed within different dielectric layers.

9. The integrated structure of claim 6, wherein the conductive protective structure has a rectangle or square shape and the alignment mark is disposed at a corner of the conductive protective structure.

10. The integrated structure of claim 6, wherein the alignment mark is configured for photolithography or defect inspection.

11. An integrated structure with a silicon-through via, comprising:

a substrate;

a through-silicon via penetrating the substrate, the through-silicon via comprising a through-silicon hole, a dielectric layer lining on a wall of the through-silicon hole and a conductive material filled in the through-silicon hole;

a conductive protective structure surrounding the through-silicon via; and a first and a second alignment marks with different shapes disposed between the through-silicon via and the conductive protective structure, wherein the first and second alignment marks are physically separated from the through-silicon via.

12. The integrated structure of claim 11, wherein the conductive protective structure, the first and the second alignment marks are disposed within the same dielectric layer.

13. The integrated structure of claim 11, wherein the conductive protective structure, the first and the second alignment marks are disposed within different dielectric layers.

14. The integrated structure of claim 11, wherein the conductive protective structure has a rectangle or square shape.

15. The integrated structure of claim 14, wherein the first and the second alignment marks are disposed at different corners of the conductive protective structure.

16. The integrated structure of claim 11, further comprising a conductive dummy pattern disposed between the conductive protective structure and the through-silicon via.

17. The integrated structure of claim 16, wherein the conductive protective structure and the conductive dummy pattern are disposed within the same dielectric layer.

18. The integrated structure of claim 16, wherein the conductive protective structure and the conductive dummy pattern are disposed within different dielectric layers.

19. The integrated structure of claim 16, wherein the conductive protective structure has a rectangle or square shape and the conductive dummy pattern is disposed at a corner of the conductive protective structure.

20. The integrated structure of claim 11, wherein the alignment mark is configured for photolithography or defect inspection.

* * * * *